United States Patent
Kaide et al.

(10) Patent No.: US 9,362,463 B2
(45) Date of Patent: Jun. 7, 2016

(54) PHOSPHOR, LIGHT-EMITTING APPARATUS INCLUDING THE SAME, AND PHOSPHOR PRODUCTION METHOD

(71) Applicant: NICHIA CORPORATION, Tokushima (JP)

(72) Inventors: Takashi Kaide, Anan (JP); Shoji Hosokawa, Tokushima (JP)

(73) Assignee: NICHIA CORPORATION, Tokushima (JP)

( * ) Notice: Subject to any disclaimer, the term of this patent is extended or adjusted under 35 U.S.C. 154(b) by 91 days.

(21) Appl. No.: 14/261,638

(22) Filed: Apr. 25, 2014

(65) Prior Publication Data

US 2014/0319568 A1    Oct. 30, 2014

(30) Foreign Application Priority Data

Apr. 26, 2013 (JP) ................................ 2013-094771
Jan. 20, 2014 (JP) ................................ 2014-007917

(51) Int. Cl.
*C09K 11/59* (2006.01)
*H01L 33/50* (2010.01)
*C09K 11/77* (2006.01)

(52) U.S. Cl.
CPC .......... *H01L 33/502* (2013.01); *C09K 11/7766* (2013.01); *C09K 11/7774* (2013.01); *H01L 2224/48091* (2013.01); *H01L 2224/48247* (2013.01); *H01L 2224/48257* (2013.01)

(58) Field of Classification Search
CPC ........... C09K 11/7774; C09K 11/0883; H01L 33/502; H01L 33/504
See application file for complete search history.

(56) References Cited

U.S. PATENT DOCUMENTS

| | | |
|---|---|---|
| 5,998,925 A | 12/1999 | Shimizu et al. |
| 2007/0007494 A1 | 1/2007 | Hirosaki et al. |
| 2010/0085728 A1 | 4/2010 | Seto et al. |
| 2012/0256533 A1* | 10/2012 | Seto .................. C04B 35/58085 313/498 |
| 2013/0234588 A1 | 9/2013 | Seto et al. |

FOREIGN PATENT DOCUMENTS

| | | |
|---|---|---|
| EP | 2141216 A1 | 1/2010 |
| JP | 3503139 B2 | 12/2003 |
| JP | 2006-8721 A | 1/2006 |
| JP | 2008-88362 A | 4/2008 |
| JP | 2008-285659 A | 11/2008 |
| JP | 2010-95728 A | 4/2010 |
| WO | 2010/114061 A1 | 10/2010 |

* cited by examiner

*Primary Examiner* — Carol M Koslow
(74) *Attorney, Agent, or Firm* — Kenyon & Kenyon LLP

(57) ABSTRACT

A phosphor is provided which is represented by the general formula $M_xCe_yPr_zSi_6N_{8+w}$. M is at least one element selected from the group consisting of La, Y, Tb and Lu. And x, y, z and w satisfy $2.0<x<3.5$, $0<y<1.0$, $0<z<0.05$, and $2.0<w<4.0$, respectively.

11 Claims, 6 Drawing Sheets

PHOSPHOR, LIGHT-EMITTING APPARATUS INCLUDING THE SAME, AND PHOSPHOR PRODUCTION METHOD

BACKGROUND OF THE INVENTION

1. Field of the Invention

The present invention relates to a phosphor, a method of producing the phosphor, and a light emitting apparatus including the phosphor; and more particularly to a nitride phosphor that is composed of a nitrogen-containing compound and can emit light in a green-to-yellow range, a light-emitting apparatus including the nitride phosphor, and a method for producing the nitride phosphor.

2. Description of the Related Art

Light-emitting apparatuses have been developed which include a light source, and a wavelength conversion member that is excited by light from the light source and can emit different color light from that of the light source. As a result, the light-emitting apparatuses can emit light in various colors based on the principle of additive light color mixing. For example, a light-emitting device emits the primary light in a short wavelength range corresponding to a range from ultraviolet to visible light so that a phosphor is excited by this emitted light. Accordingly, the primary light is at least partially converted into light having a different wavelength from the primary light. As a result, desired light (e.g., red, blue, green or the like) can be provided. Also, white light can be provided by additive color mixture of different light components.

Based on the principle, LED lamps have been used which include light-emitting diodes (hereinafter, referred to as LEDs) for many fields such as signal light, mobile phone, various types of illuminations, vehicle indicator, or various types of display apparatuses. In particular, with the increasing application of white LED light-emitting apparatuses including an LED and a phosphor to liquid crystal display (LCD) backlight, electronic flash, and the like, the use of the white LED light emitting apparatuses has increased. In addition, recently, the white LED light-emitting apparatuses are tried to be used as a lighting apparatus. Since the white LED light-emitting apparatuses have advantages such as long life and being mercury-free, in order to reduce the environmental load, it is expected that the white LED light-emitting apparatuses can serve as a replacement light source for a fluorescent lamp.

A light-emitting apparatus including a white LED includes a blue LED and a yellow phosphor (for example, see Japanese Patent Publication No. JP 3,503,139 B). This light-emitting apparatus mixes blue light emitted from the LED with yellow light that is converted from the blue light from the LED by the yellow phosphor, whereby emitting white light. In this case, the phosphor used in this light-emitting apparatus is required to be efficiently excited by blue light with a wavelength from 420 to 470 that is emitted by the LED, and to emit light in a yellow range.

Also, the LED light-emitting apparatus is actively studied to increase its light emission properties. For example, in order to increase the brightness of white light, it is important to increase the intensities of both the light components for different colors. For this reason, a phosphor is required which can convert the primary light from the LED at a high energy efficiency. In addition, in order to improve the color rendering property or color purity of white light, it is important that the light components have designed colors. To achieve this, the phosphor is required to have its peak wavelength in a predetermined wavelength range.

An yttrium aluminum garnet group phosphor activated by cerium is known as a yellow phosphor. Also, it is known that Y of this yellow phosphor can be partially substituted by Lu, Tb, Gd or the like, or Al of this yellow phosphor can be partially substituted by Ga or the like. The light wavelength of the yttrium aluminum garnet group phosphor activated by cerium can be widely adjusted by adjustment of composition.

In addition, as for phosphors other than these oxide phosphors, nitride phosphors are also known which have properties different from other inorganic compounds. In particular $Si_3N_4$, AlN, BN, GaN, and the like are used in a variety of applications such as substrate materials, semiconductors, light-emitting diodes, and are industrially produced. Also, nitride phosphors including three or more elements have been widely studied in recent years. Some nitride compounds were reported which were excited by a blue LED or near-ultraviolet LED, and emitted light in a blue-to-red range.

Since the compounds or phosphors have different light emission spectrums, in the case where two or more of these compounds or phosphors are used, the white LED light-emitting apparatuses may have further improved properties. For example, in the case where a $(Sr, Ca)AlSiN_3$:Eu phosphor as a nitride group phosphor is used in the white LED light-emitting apparatus disclosed in JP 3,503,139 B, the color rendering property and the color reproduction range can be improved (for example, see Japanese Patent Laid-Open Publication No. JP 2006-8,721 A).

Also, in the case the yttrium aluminum garnet group phosphor activated by cerium capable of emitting a yellow light component is replaced by some other phosphors, the color rendering property and the color reproduction range can be improved.

For example, $La_3Si_6N_{11}$:Ce is disclosed as one of the some other phosphors (e.g., see Japanese Patent Laid-Open Publication No. JP 2008-88,362 A).

The present invention is devised to solve the above problems. It is a main object of the present invention to provide a phosphor that includes a particular compound for increasing the red light component while keeping the green light component high as compared with $La_3Si_6N_{11}$:Ce, a method for producing this phosphor, and a light-emitting apparatus including this phosphor.

SUMMARY OF THE INVENTION

A phosphor according to one aspect of the present invention includes a compound that is represented by the general formula $M_xCe_yPr_zSi_6N_{8+w}$. M is at least one element selected from the group consisting of La, Y, Tb and Lu. And x, y, z and w satisfy $2.0<x<3.5$, $0<y<1.0$, $0<z<0.05$, and $2.0<w<4.0$, respectively.

A light-emitting apparatus according to another aspect of the present invention includes an excitation light source, the aforementioned phosphor as a first phosphor, and a wavelength conversion member. The excitation light source can emit light in a range from ultraviolet to blue light. The first phosphor can absorb a part of the light from the excitation light source, and can emit luminescent radiation. The first phosphor is distributed in the wavelength conversion member.

A phosphor production method according to still another aspect of the present invention includes a preparation pulverization and mixture step, a filling and burning step, and a solid-liquid separation, drying, pulverization, dispersion and filtering step. In the preparation pulverization and mixture step, materials for elements to compose a composition of phosphor as the elements themselves, or oxide, nitride or carbonate of the elements, are prepared, pulverized, and mixed. In the filling and burning step, a crucible is filled with the obtained materials, and the obtained materials are burned in a reducing atmosphere. In the solid-liquid separation, pulverization, dispersion and filtering step, the burned product is subjected to solid-liquid separation, and the product after the solid-liquid separation is dried, pulverized, dispersed and filtered so that phosphor powder is obtained. The composition of the phosphor is represented by the general formula $M_xCe_yPr_zSi_6N_{8+w}$. M is at least one element selected from the group consisting of La, Y, Tb and Lu. And x, y, z and w satisfy $2.0<x<3.5$, $0<y<1.0$, $0<z<0.05$, and $2.0<w<4.0$, respectively.

According to the present invention, it is possible to increase the red light component while keeping a green light component high.

The above and further objects of the present invention as well as the features thereof will become more apparent from the following detailed description to be made in conjunction with the accompanying drawings.

DETAILED DESCRIPTION OF THE EMBODIMENT(S)

Figure 1:
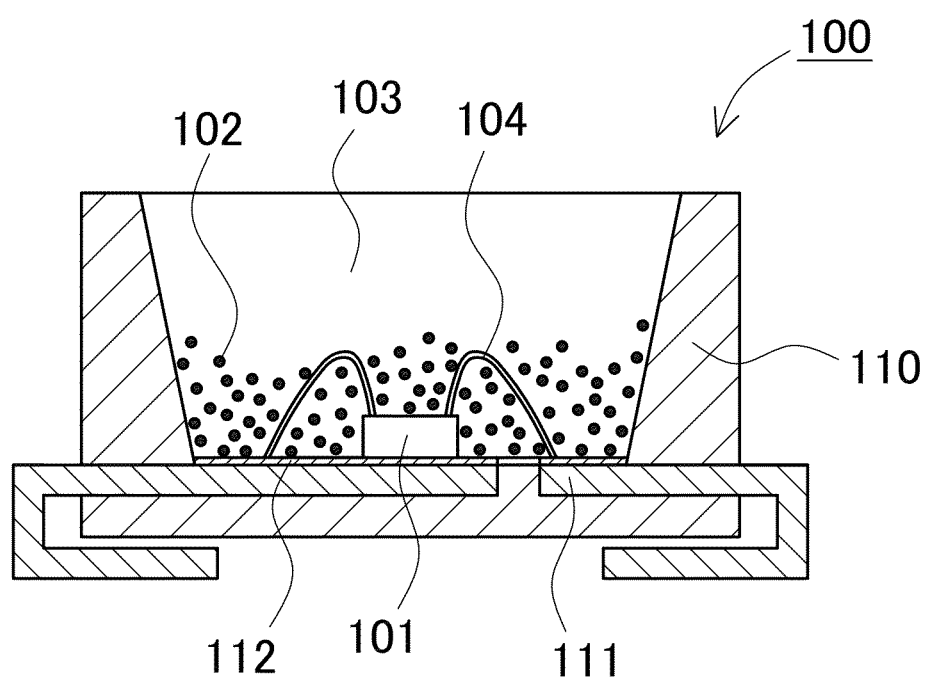
FIG. 1 is a cross-sectional view showing a light-emitting apparatus according to an embodiment of the present invention.

The following description will describe embodiments according to the present invention with reference to the drawings. It should be appreciated, however, that the embodiments described below are illustrations of a phosphor, a method for producing the phosphor and a light emitting apparatus that includes the phosphor to give a concrete form to technical ideas of the present invention; and a phosphor, a method for producing the phosphor and a light emitting apparatus that includes the phosphor of the present invention are not specifically limited to the description below.

A phosphor according to an embodiment of the present invention includes a compound that is represented by the general formula $M_xCe_yPr_zSi_6N_{8+w}$. M is at least one element selected from the group consisting of La, Y, Tb and Lu. And x, y, z and w satisfy $2.0<x<3.5$, $0<y<1.0$, $0<z<0.05$, and $2.0<w<4.0$, respectively. It is more preferable that x, y and z satisfy $2.0<x<3.0$, $0<y<0.5$, $0<z<0.03$, respectively.

Also, in a phosphor according to another embodiment, the phosphor absorbs light in a range from ultraviolet light to visible blue light and emits light different from the absorbed light, and the light emitted by the phosphor has a light emission spectrum including first and second peaks. The wavelengths of the first and second peaks fall within ranges from 515 to 545 nm, and 610 to 620 nm, respectively.

Also, in a phosphor according to another embodiment, the light emission intensity ratio ($I_{p2}/I_{p1}$) of the second light-emitting peak relative to the first light-emitting peak is defined in the emission spectrum. The light emission intensity ratio satisfies $0.56<I_{p2}/I_{p1}$.

Since the aforementioned phosphor contains Pr, it is possible to increase the light emission intensity in the wavelength range from 610 to 620 nm. As a result, it is possible to increase a red light component, whereby improving a color rendering property.

Also, in a phosphor according to another embodiment, the phosphor can further contain fluorine. In this embodiment, the content of fluorine falls within a range from 10 to 10,000 ppm.

Also, in a phosphor according to another embodiment, the phosphor can further contain oxygen. In this embodiment, the content of oxide falls within a range from 100 to 10,000 ppm.

Also, in a phosphor according to another embodiment, it is preferable that the phosphor have a crystal phase, the percentage of which is not less than 50% by weight.

Also, a light-emitting apparatus according to another embodiment can include the aforementioned phosphor as a first phosphor, and at least one second phosphor that can absorb at least a part of the light from the excitation light source, and can emit luminescent radiation with a peak wavelength different from that of the first phosphor.

Also, in a phosphor production method according to another embodiment, the burned product can further be placed in acid solution, whereby reducing the content of impurities contained in the burned product.

Also, in a phosphor production method according to another embodiment, the acid solution can contain hydrochloric acid.

Also, in a phosphor production method according to another embodiment, it is preferable that the phosphor further contains fluorine. The content of fluorine in the produced phosphor preferably falls within a range from 10 to 10,000 ppm. The reason is to provide a sufficient flux effect without adverse effect on the properties of the phosphor.

Since the phosphor contains fluorine as flux, it is possible to increase the reactivity of the material for the phosphor according to the present invention.

In the description of the present invention, a relationship between color name and chromaticity coordinates, a relationship between light wavelength range and monochromatic light, and the like are based on the JIS standard (JIS Z8110). Specifically, a range of 380 to 455 nm corresponds to the bluish violet color, a range of 455 to 485 nm corresponds to blue, a range of 485 to 495 nm corresponds to bluish green, a range of 495 to 548 nm corresponds to green, a range of 548 to 573 nm corresponds to yellowish green, a range of 573 to 584 nm corresponds to yellow, a range of 584 to 610 nm corresponds to apricot, and a range of 610 to 780 nm corresponds to red.

EMBODIMENT(S)

A phosphor according to an embodiment contains silicon and nitrogen, and activated by Ce and Pr. The phosphor can absorb light in an ultraviolet to blue range, and emit light. The phosphor is represented by the following general formula.

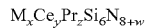

$$M_xCe_yPr_zSi_6N_{8+w}$$

where M is at least one element selected from the group consisting of La, Y, Tb and Lu, and x, y, z and w satisfy $2.0<x<3.5$, $0<y<1.0$, $0<z<0.05$, and $2.0<w<4.0$, respectively.

More preferably, x satisfies $2.0<x<3.3$, and most preferably $2.0<x<3.0$. The reason to set the lower limit of the x range is to efficiently obtain the target composition of phosphor. For example, in the case where the target composition of phosphor is $La_3Si_6N_{11}$, unintended $LaSi_3N_5$ may be produced. In this case, a classification process or other process is additionally required to separate the target composition of the phosphor from the other composition. Contrary to this, according to the present invention, since x satisfies the above range, adjustment of the composition of phosphor can simply increase the probability that the target composition of phosphor will be obtained without time and effort. Also, the reason to set the upper limit of the x range is to prevent waste of La, since even if La is added more than the upper limit an excess amount of La over the upper limit hardly contributes to production of the target composition of phosphor.

Also, y more preferably satisfies $0<y<0.8$, and most preferably $0<y<0.5$. Although a certain amount of Ce is required to provide light emission at the target wavelength, if the amount of Ce is too much, Ce elements as activator will interfere with each other, which in turn may reduce the light emission intensity of the phosphor. The reason to define the y range is to prevent the reduction of the light emission intensity of the phosphor.

Also, z more preferably satisfies $0<z<0.04$, and most preferably $0<z<0.03$. Although a certain amount of Pr is required to increase a red light component, if the amount of Pr is too much, Pr, which also serves as an activator, will disturb light emission of Ce, which in turn may reduce the entire light emission intensity of the phosphor. The reason to define the z range is to prevent the reduction of the entire light emission intensity of the phosphor.

For example, when light emission intensity ($I_{p615}$) at 615 nm is defined relative to light emission intensity ($I_{p535}$) at 535 nm, this phosphor provides relative light emission intensity $0.56<I_{p615}/I_{p535}$ in light emission when absorbing light in a range from ultraviolet to blue light.

In addition, it is preferable to add a flux compound to one or more of the materials for the phosphor, so that the flux compound is brought in as a liquid at a burning temperature. Also, it is preferable that the burned product be placed in an acid solution, whereby reducing the content of impurities contained in the obtained product.

Also, it is preferable that the phosphor be at least partially crystallized. For example, if the phosphor is in a vitreous (amorphous) state, the component ratio of the phosphor will be uneven. The reason is that the structure in a vitreous state does not have a regular arrangement. As a result, the phosphor in the vitreous state may produce uneven color light. In order to avoid this, it is necessary to provide highly uniform reaction conditions in production processes. On the other hand, since the phosphor according to this embodiment can be powder or granular matter that is not in a vitreous phase but in a crystalline phase, the phosphor can be easily produced and be easily subjected to treatment. In addition, this phosphor can be uniformly dissolved in organic solvent. Accordingly, a luminescent plastic or polymer thin film can be easily adjusted. Specifically, the percentage of crystal phase in the phosphor according to this embodiment preferably falls within a range not less than 50% by weight, and more preferably not less than 80%. This percentage corresponds to the percentage of crystal phase in the phosphor capable of emitting light. In the case where the percentage of crystal phase in the phosphor is not less than 50%, luminescent radiation of the phosphor can be practically used. From this viewpoint, the phosphor preferably has a percentage of crystal phase as high as possible. In this case, the light emission intensity of the phosphor can be high, and the phosphor can be more easily subjected to treatment.

(Particle Diameter)

It is preferable that the particle diameter of the phosphor falls within a range 1 to 50 μm, and more preferably 2 to 30 μm in terms of use in the light-emitting apparatus. In addition, it is preferable that the percentage of the phosphor with the above mean particle diameter be high. Also, the particle size distribution is preferably narrow. In the case where a phosphor is used which has less unevenness of particle diameter or particle size distribution, and has a large particle diameter and excellent optical properties, color unevenness can be reduced. Therefore, it is possible to provide a light-emitting apparatus with excellent color tone. Accordingly, in the case where the phosphor has a particle diameter in the above range, light absorption and conversion efficiencies can be high. A phosphor with a particle diameter less than 2 μm is likely to form an aggregate.

(Production Method)

The following description will describe a method for producing the phosphor according to this embodiment. Materials for elements to compose the composition of the phosphor according to this embodiment can be the elements themselves, or oxide, carbonate, nitride or the like of the elements. These materials are measured to provide a predetermined composition ratio. Additives such as flux can be suitably added to the materials.

Specifically, it is preferable to use nitride or oxide of Si in the composition of the phosphor as a material for the phosphor. However, imide, amide or other compound of Si also can be used. Examples of the material of Si is provided by $Si_3N_4$, $SiO_2$, $Si(NH)_2$, and the like. However, in the case where Si itself is used alone, the nitride phosphor can be inexpensively produced, and can have good crystallinity. The purity of the material is preferably 2N or more. However, the material may contain other elements such as Li, Na, K, B. Also, Si can also be partially substituted by Al, Ga, In, Tl, Ge, Sn, Ti, Zr, or Hf.

Also, it is preferable to use nitride, oxide or the like of La in the composition of the phosphor as a material for the phosphor. However, other compounds of La or La itself can be used. Examples of the material for La can be provided by LaN, $La_2O_3$, LaSi, $LaSi_2$ and the like. The purity of the material is preferably 2N or more. However, the material may contain other rare earth elements. Also, it is preferable to use nitride, oxide or the like of Ce and Pr in the composition of the phosphor as materials for activators of the phosphor. However, other compounds of Ce and Pr, or Ce and Pr themselves can be used. Examples of other materials for Ce and Pr can be provided by halide, carbonate, phosphate, silicate, and the like of Ce and Pr. In particular, it is preferable that cerium fluoride, which is a fluoride, be used as a material for Ce as activator. The reason is that cerium fluoride serves not only as material of the phosphor, but also as a flux.

The materials can be mixed in a dry or wet manner by a mixer. The materials can be mixed by a pulverizer as a mixer for increasing the specific surfaces of the materials. Ball mills are widely used as a pulverizer in commerce. In addition to ball mills, vibration mills, roll mills, jet mills, mortars and pestles, or the like can be used as the pulverizer. Also, the materials can be mixed by a pulverizer and a mixer such as ribbon blender, V-type blender, and Henschel mixer. In order that the specific surfaces of the materials may fall within certain ranges, the materials can be classified by a wet separator such as a settling tank, hydrocyclone or centrifuge, or a dry classifier such as a cyclone or air separator. These wet separators and dry classifiers are widely used in commerce. Materials that are unstable in the air are mixed in an argon or nitrogen atmosphere in a glove box.

The aforementioned mixed materials are placed in a crucible such as a SiC, quartz, alumina or BN crucible, and are burned in a reducing atmosphere of $N_2$ and $H_2$. The burning atmosphere may be an argon, ammonia, carbon monoxide or hydrocarbon atmosphere, or the like. The materials are burned at a temperature in a range from 1,000° to 2,000° C. for 1 to 30 hours. The burning pressure is set to a pressure in a range from atmospheric pressure to 10 atmospheres. The materials can be burned by tubular furnace, high-frequency furnace, metal furnace, atmosphere furnace, gas-heating furnace, or the like.

The target phosphor powder is obtained by pulverization, dispersion, filtration and the like of the burned product. The target phosphor powder is subjected to solid-liquid separation. Solid-liquid separation is conducted by filtration, suction filtration, pressure filtration, centrifugal separation, decantation, or the like, which is widely used in commerce. The target phosphor powder can be dried by vacuum dryer, heating dryer, conical dryer, rotary evaporator, or the like, which is widely used in commerce. In addition, in order to remove parts other than the target crystal phase, the target phosphor powder can be placed in an acid solution. In this case, it is possible to further improve the light emission efficiency.

(Light-Emitting Apparatus)

The following description describes a light-emitting apparatus 100 (see FIG. 1) according to this embodiment that includes the phosphor. For example, a lighting apparatus (e.g., fluorescent lamp), a display apparatus (e.g., display and radar), LCD, and the like can be used as the light-emitting apparatus. It is preferable to use a light-emitting device that emits light in a range from near-ultraviolet light to short-wavelength visible light as the excitation light source. In particular, semiconductor light-emitting devices can be small and highly effective in power consumption, and can emit vivid color light. Mercury-vapor lamps or the like, which are used for existing fluorescent lamps, can be also suitably used as another excitation light source.

Various shapes of light-emitting apparatuses including a light-emitting device are known, such as so-called bullet type and surface-mount type light-emitting apparatuses. The light emitting apparatus according to this embodiment, which is a surface-mount type light-emitting apparatus, is now described with reference to FIG. 1.

FIG. 1 is a schematic view showing the light-emitting apparatus 100 according to this embodiment. The light-emitting apparatus 100 according to this embodiment includes a package 110 that has a recessed portion, a light-emitting device 101, and a sealing member 103 that covers the light-emitting device 101. The light-emitting device 101 is arranged on the bottom surface 112 of the recessed portion of the package 110, and is electrically connected by conductive wire lines 104 to a pair of lead terminals (positive/negative lead terminals) 111 that are arranged in the package 110. The recessed portion is filled with the sealing member 103, which is formed of resin containing the phosphor 102. End parts of the positive/negative lead terminals 111 protrude from outside surfaces of the package 110, and are bent so that the end parts extend along the exterior shape of the package 110. The light-emitting apparatus 100 is supplied with electric power through the lead terminals 111 from the outside, whereby emitting light. The following description will describe components of the light-emitting device according to this embodiment.

(Light-Emitting Device 101)

The light-emitting device 101 can emit light in a range from ultraviolet to visible light. The peak wavelength of light emitted by the light-emitting device 101 preferably falls within a range from 240 to 520 nm, more preferably from 420 to 470 nm. For example, a nitride semiconductor device $(In_xAl_yGa_{1-x-y}N, 0 \le x, 0 \le y, x+y \le 1)$ can be used as the light-emitting device 101. In the case where a nitride semiconductor device is used, it is possible to provide a mechanical-shock-resistant, stable, light-emitting apparatus.

(Phosphor)

The phosphor 102 according to this embodiment is distributed in a part of the sealing member 103. According to this embodiment, the sealing member serves not only as a member for protecting the light-emitting device and the phosphor from the external environments, but also as a wavelength conversion member. In the case where the sealing member including the phosphor is arranged in proximity to the light-emitting device 101, the light from the light-emitting device 101 can be efficiently converted into light with a different wavelength from the light from the light-emitting device. As a result, it is possible to provide a light-emitting apparatus with good light emission efficiency. However, the member including the phosphor is not limited to be arranged in proximity to the light-emitting device. In consideration of influence of heat on the phosphor, the wavelength conversion member containing the phosphor can be spaced at a certain interval from the light-emitting device. Also, the phosphor 102 can be mixed in the sealing member 103 at a substantially even ratio, whereby reducing color unevenness of light.

Also, two or more types of phosphors 102 can be used. For example, the light-emitting apparatus 100 according to this embodiment can include the light-emitting device 101 for emitting blue light, the phosphor according to the embodiment excited by the blue light, and the phosphor for emitting red light. In this case, the light-emitting apparatus can emit white light with good color rendering. Examples of the phosphor for emitting red light to be used together with the phosphor according to this embodiment can be provided by nitride phosphors such as $(Ca_{1-x}Sr_x)AlSiN_3$:Eu ($0 \le x \le 1.0$) and $(Ca_{1-x-y}Sr_xBa_y)_2Si_5N_8$:Eu ($0 \le x \le 1.0$, $0 \le y \le 1.0$), halide phosphors such as $K_2(Si_{1-a-b}Ge_aTi_b)F_6$:Mn ($0 \le a \le 1$, $0 \le b \le 1$). In the case where these phosphors for emitting red light are used together with the phosphor according to this embodiment, components corresponding to three primary colors can have wide half-value widths. As a result, the light-emitting apparatus can emit warm white light.

Other examples of the phosphors for emitting red light to be used together with the phosphor according to this embodiment can be provided by oxysulfide phosphors activated by Eu, such as $(La,Y)_2O_2S$:Eu, sulfide phosphor activated by Eu, such as (Ca, Sr)S:Eu, halophosphate phosphors activated by Eu and Mn, such as $(Sr, Ca, Ba, Mg)_{10}(PO_4)_6Cl_2$:Eu, Mn, oxide phosphors activated by Ce such as Lu$_2$CaMg$_2$(Si, Ge)$_3$O$_{12}$:Ce, and oxynitride phosphors activated by Eu, such as α-SIALON phosphor.

Also, a green or blue phosphor can be used together with the phosphor according to this embodiment. In the case where a phosphor is added which emits green or blue light with a peak wavelength slightly different from the phosphor according to the present invention, the color reproduction range and the color rendering property can be further improved. Also, in the case where a phosphor is added which absorbs ultraviolet light and emits blue light, a light-emitting device that emits ultraviolet light can be used instead of the light-emitting device that emits blue light, so that the color reproduction range and the color rendering property are improved.

Examples of the phosphors for emitting green light to be used together with the phosphor according to this embodiment can be provided by silicate phosphors such as (Ca, Sr, Ba)$_2$SiO$_4$:Eu and Ca$_3$Sc$_2$Si$_3$O$_{12}$:Ce, chlorosilicate phosphors such as Ca$_8$MgSi$_4$O$_{16}$Cl$_{2-\delta}$:Eu, Mn, oxynitride phosphors such as β-SIALON of (Ca, Sr, Ba)$_3$Si$_6$O$_9$N$_4$:Eu, (Ca, Sr, Ba)$_3$Si$_6$O$_{12}$N$_2$:Eu, (Ca, Sr, Ba)Si$_2$O$_2$N$_2$:Eu, CaSc$_2$O$_4$:Ce, Si$_{6-z}$Al$_z$O$_z$N$_{8-z}$:Eu, etc., aluminate phosphor activated by Ce, such as (Y, Lu)$_3$(Al, Ga)$_5$O$_{12}$:Ce, and sulfide phosphors activated by Eu, such as SrGa$_2$S$_4$:Eu.

Examples of the phosphors for emitting blue light to be used together with the phosphor according to this embodiment can be provided by aluminate phosphors activated by Eu, such as (Sr, Ca, Ba)Al$_2$O$_4$:Eu, (Sr, Ca, Ba)$_4$Al$_{14}$O$_{25}$:Eu, (Ba, Sr, Ca)MgAl$_{10}$O$_{17}$:Eu, and BaMgAl$_{14}$O$_{25}$:Eu, Tb, Sm, aluminate phosphors activated by Eu and Mn, such as (Ba, Sr, Ca)MgAl$_{10}$O$_{17}$:Eu, Mn, thiogallate phosphors activated by Ce, such as SrGa$_2$S$_4$:Ce and CaGa$_2$S$_4$:Ce, and halophosphate phosphors activated by Eu, such as (Sr, Ca, Ba, Mg)$_{10}$(PO$_4$)$_6$Cl$_2$:Eu.

(Sealing Member)

The sealing member 103 is formed of transparent resin or glass. The recessed portion of the light-emitting apparatus 100 is filled with the transparent resin or glass so that the light-emitting device 101 is covered by the transparent resin or glass. In terms of ease of production, the sealing member is preferably formed of transparent resin. A silicone resin composition or the like is preferably used as the transparent resin. However, an electrically insulating resin composition such as epoxy resin composition, acrylic resin composition or the like can be also used. An additive member can be suitably included together with the phosphor 102 in the sealing member 103. For example, a light diffusion member can be added to the sealing member. In this case, the directivity from the light emitting device can be reduced so that the viewing angle can be increased.

The following description will describe phosphors according to examples 1 to 4 of the present invention. Lanthanum nitride (LaN), silicon nitride (Si$_3$N$_4$), praseodymium nitride (PrN), and cerium fluoride (CeF$_3$) are used as materials for the phosphors according to the examples 1 to 4. The phosphors are obtained based on measurement of the materials at the following preparation composition ratios. It should be appreciated, however, that the examples described below are illustrations of a phosphor and a phosphor production method to give a concrete form to technical ideas of the present invention, and a phosphor and a phosphor production method of the present invention are not specifically limited to the description below.

Example 1

In the example 1, the materials are measured at a preparation composition ratio of La:Si:Ce:Pr=3:6:0.15:0.0005. More specifically, the following powder materials are measured as materials for the phosphor according to the example 1. Here, the purities of the materials for the phosphor are assumed 100%.

Lanthanum Nitride (LaN) . . . 5.97 g
Silicon Nitride (Si$_3$N$_4$) . . . 3.65 g
Praseodymium Nitride (PrN) . . . 0.001 g
Cerium Fluoride (CeF$_3$) . . . 0.38 g The measured materials are sufficiently mixed in a dry manner, and placed in a crucible. The materials are burned at 1,500° C. for 10 hours. The burned product is pulverized and then placed in hydrochloric acid solution. Thus, phosphor powder is obtained.

Examples 2-4 and Comparative Example 1

Similar to the example 1, the materials are adjusted to the mixture ratios shown in the following Table 1, and phosphors according to examples 2 to 4 and a comparative example 1 are obtained. The particle diameters, powder properties, intensities and the like are measured. In Table 1, Dm means particle diameter (μm). The particle diameters are measured by particle measurement using electric resistance based on aperture's electrical resistance method (electrical sensing zone method) as Coulter principle. More specifically, after the phosphors are dispersed in a solution, their particle diameters are obtained based on the electric resistances that are produced when particles of the phosphors pass through an aperture of an aperture tube.

Figure 2:
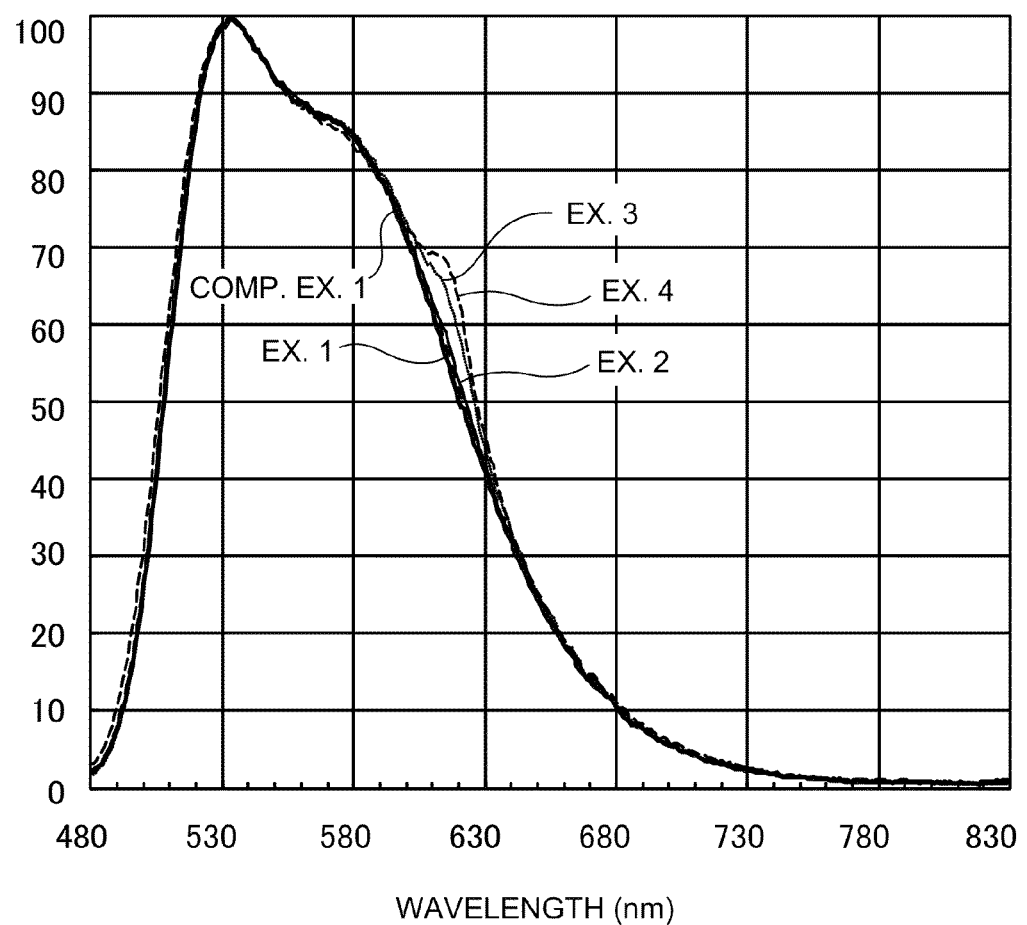
FIG. 2 is a graph showing the light emission spectrums of phosphors according to examples 1 to 4 of the present invention, and a comparative example 1.
Figure 3:
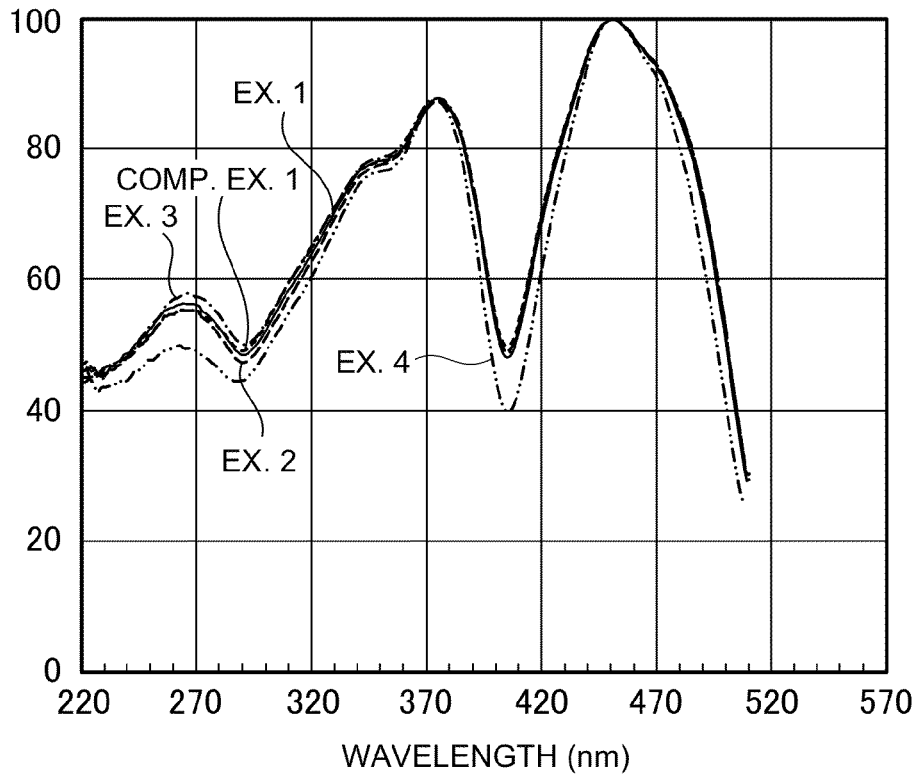
FIG. 3 is a graph showing the excitation spectrums of the phosphors according to the examples 1 to 4 of the present invention, and comparative example 1.
Figure 4:
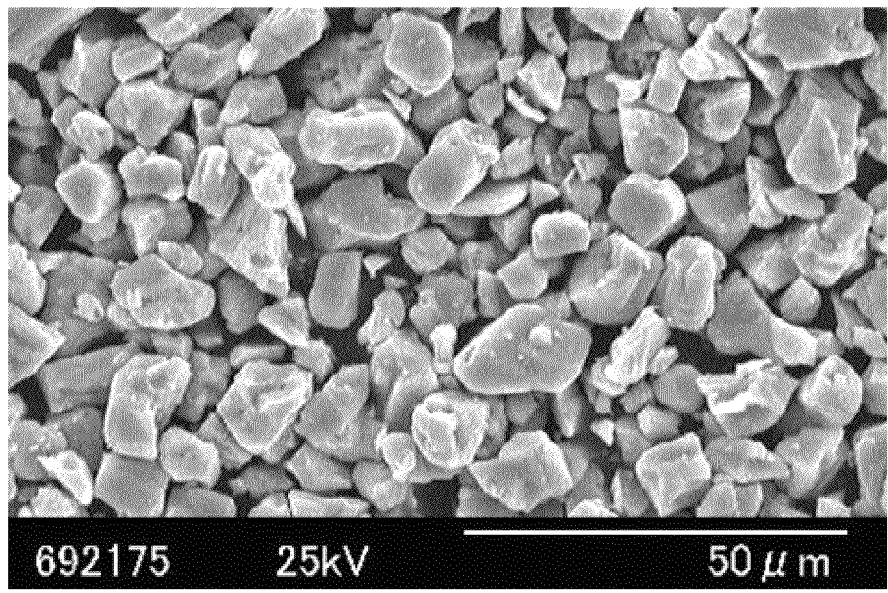
FIG. 4 is a SEM (scanning electron microscope) image of the phosphor according to the example 4 of the present invention magnified by 1,000 times.

FIGS. 2 and 3 show the normalized light emission spectrums and excitation spectrums of the phosphors according to the examples 1 to 4 and the comparative example 1, respectively. FIG. 4 is a SEM image of the phosphor according to the example 4, magnified by 1,000 times. Table 2 shows composition ratios obtained by an analysis apparatus. The symbol "-" in Table 2 shows that the analyzed value of Pr is smaller than the detectable limit of the analysis apparatus. As shown in Table 1 and FIG. 2, the light emission intensity ratios at wavelength 615 nm (I$_{p615}$) of the phosphors according to the examples are higher than that of the phosphor according to the comparative example 1. In other words, the red light component of the phosphors according to the examples is increased as compared with the phosphor according to the comparative example 1.

The light emission intensities of the phosphors according to the examples are relatively high substantially at wavelength 615 nm. For this reason, the red light component intensity is defined at wavelength 615 nm in the examples. However, the red light component intensity is not limited to wavelength 615 nm. For example, the red light component intensity can be defined at a wavelength in a range from 610 to 620 nm, such as 610, 615, and 620 nm, for calculation of the light emission intensity ratio to evaluate increase in red light component.

Also, the light emission intensities of the phosphors are the highest at wavelength 535 nm in their spectrums. For this reason, the red light component intensity is defined relative to the light emission intensity at wavelength 535 nm. However, the red light component intensity can be defined relative to the intensity at another wavelength other than 535 nm for calculation of the light emission intensity ratio to evaluate increase in red light component.

In light-emitting apparatuses that include the phosphors according to the examples and the light-emitting device, it can be confirmed that the color rendering property and the color reproduction range are improved. As shown in FIG. 3, it can be confirmed that the phosphors according to the examples are efficiently excited by blue light in a wavelength range from 420 to 470 nm. Also, as shown in Table 1 and FIG. 4, it is confirmed that the phosphors have particle diameters in a range from 2 to 30 μm.

TABLE 1

| Sample | La | Si | Ce | Pr | Particle Dia. Dm | x | y | Powder Properties Relative Intensity | Intensity 535 nm | Intensity 615 nm | Intensity Ratio 615 nm/ 535 nm |
|---|---|---|---|---|---|---|---|---|---|---|---|
| Comp. Ex. 1 | 3 | 6 | 0.15 | 0 | 18.3 | 0.419 | 0.557 | 100.0 | 99.2 | 55.8 | 0.56 |
| Ex. 1 | | | | 0.0005 | 15.8 | 0.419 | 0.556 | 95.4 | 94.3 | 54.2 | 0.58 |
| Ex. 2 | | | | 0.001 | 13.7 | 0.420 | 0.556 | 95.0 | 93.9 | 55.7 | 0.59 |
| Ex. 3 | | | | 0.003 | 18.7 | 0.424 | 0.553 | 93.8 | 92.3 | 60.0 | 0.65 |
| Ex. 4 | | | | 0.01 | 8.3 | 0.422 | 0.551 | 76.1 | 73.9 | 50.8 | 0.69 |

TABLE 2

| Sample | Composition (Base on Analyzed Value) | | | | Analyzed Value (ppm) | | |
|---|---|---|---|---|---|---|---|
| | La | Si | Ce | Pr | N | F | O |
| Comp. Ex. 1 | 2.66 | 6.00 | 0.13 | — | 10.70 | 1200 | 1020 |
| Ex. 1 | 2.58 | 6.00 | 0.13 | 0.0005 | 10.40 | 740 | 2010 |
| Ex. 2 | 2.60 | 6.00 | 0.13 | 0.0009 | 10.42 | 1500 | 1820 |

TABLE 2-continued

| Sample | Composition (Base on Analyzed Value) | | | | Analyzed Value (ppm) | | |
|---|---|---|---|---|---|---|---|
| | La | Si | Ce | Pr | N | F | O |
| Ex. 3 | 2.65 | 6.00 | 0.13 | 0.0044 | 10.76 | 1500 | 1310 |
| Ex. 4 | 2.69 | 6.00 | 0.16 | 0.0148 | 10.92 | 1700 | 4550 |

Example 5 and Comparative Examples 2-3

Figure 5:
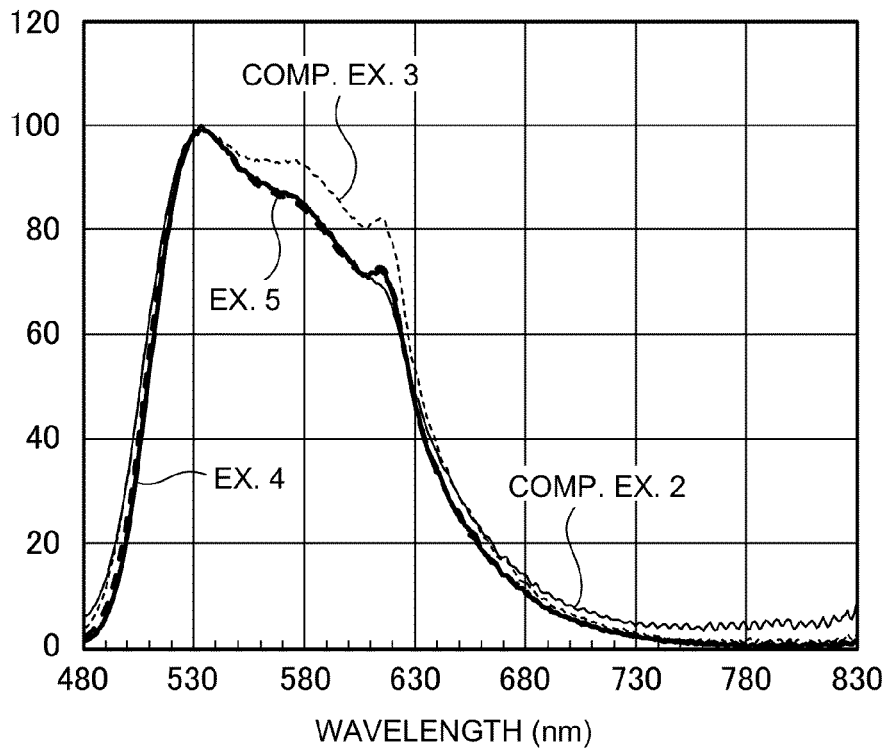
FIG. 5 is a graph showing the normalized light emission spectrums of phosphors according to examples 4 to 5 of the present invention, and comparative examples 2 to 3.
Figure 6:
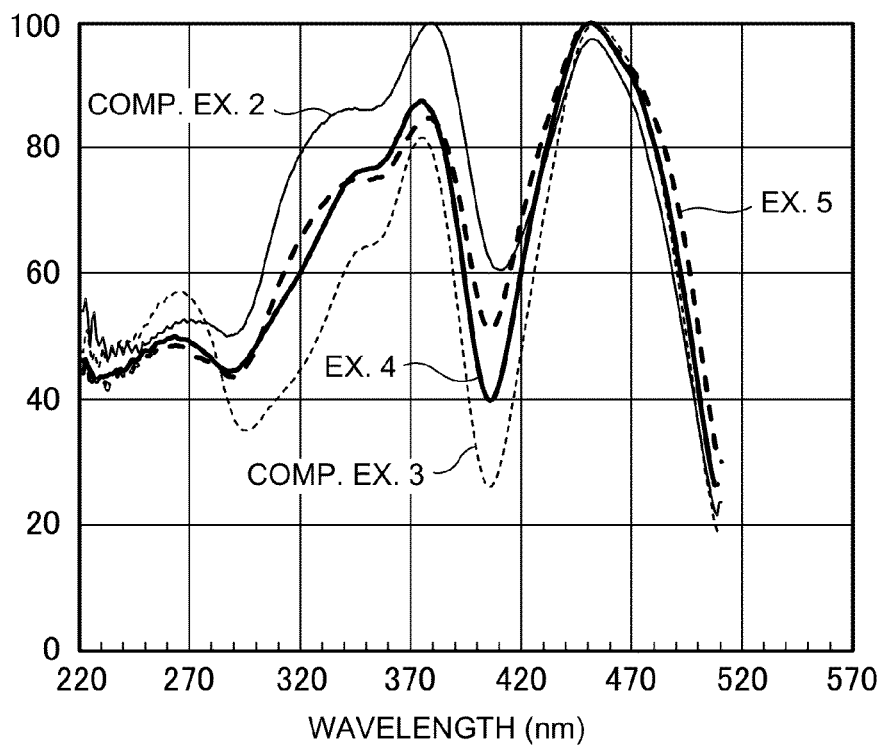
FIG. 6 is a graph showing the excitation spectrums of the phosphors according to the examples 4 to 5 of the present invention, and the comparative examples 2 to 3.

Relative intensities and the like of phosphors according to an example 5 and comparative examples 2 to 3 are measured which have different composition ratios of La on the basis of the phosphor according to the example 4. The measured values of the phosphors according to the example 5 and the comparative examples 2 to 3 are shown in Tables 3 to 4, and FIGS. 5 to 6. Also, similar to the example 1, etc., the materials are adjusted to the mixture ratios shown in the Table 3, and the phosphors according to the example 5 and the comparative examples 2 to 3 are obtained. The particle diameters, powder properties, intensities and the like are measured. Similar to Table 1, Dm is an index of particle diameter (μm) in Table 3. Also, FIGS. 5 and 6 show the normalized light emission spectrums and excitation spectrums of the phosphors according to the example 5 and the comparative examples 2 to 3, respectively. Table 4 shows composition ratios obtained by the analysis apparatus. As shown in Table 3 and FIG. 5, the relative intensity of the phosphor according to the example 5 is higher than those of the comparative examples 2 to 3. In other words, it can be confirmed that the relative intensity of the phosphor according to the example 5 is improved. According to this result, when the compounding ratio of La is not higher than 2 or not lower than 3.5, the relative intensity of the phosphor remarkably decreases. For this reason, it is preferable that the compounding ratio of La be higher than 2 and lower than 3.5. As shown in FIG. 6, it can be confirmed that the phosphor according to the example 5 is efficiently excited by blue light in a wavelength range from 420 to 470 nm.

TABLE 3

| Sample | La | Si | Ce | Pr | Particle Dia. Dm | x | y | Powder Properties Relative Intensity | Intensity 535 nm | Intensity 615 nm | Intensity Ratio 615/535 |
|---|---|---|---|---|---|---|---|---|---|---|---|
| Comp. Ex. 2 | 2 | 6 | 0.15 | 0.01 | 10.1 | 0.423 | 0.548 | 19.4 | 19.0 | 13.3 | 0.70 |
| Ex. 5 | 2.5 | | | | 12.6 | 0.426 | 0.550 | 48.8 | 47.6 | 35.0 | 0.73 |
| Ex. 4 | 3 | | | | 8.3 | 0.422 | 0.551 | 76.1 | 73.9 | 50.8 | 0.69 |
| Comp. Ex. 3 | 3.5 | | | | 21.2 | 0.432 | 0.541 | 31.4 | 29.0 | 24.0 | 0.83 |

TABLE 4

| Sample | Composition (Analyzed Value) | | | | Analyzed Value (ppm) | | |
|---|---|---|---|---|---|---|---|
| | La | Si | Ce | Pr | N | F | O |
| Comp. Ex. 2 | 1.89 | 6.00 | 0.14 | 0.0110 | 9.88 | 2600 | 4500 |
| Ex. 5 | 2.14 | 6.00 | 0.12 | 0.0115 | 10.06 | 2100 | 4260 |
| Ex. 4 | 2.69 | 6.00 | 0.16 | 0.0148 | 10.92 | 1700 | 4550 |
| Comp. Ex. 3 | 2.20 | 6.00 | 0.10 | 0.0146 | 7.70 | 11000 | 85430 |

Examples 6-7 and Comparative Example 4

Figure 7:
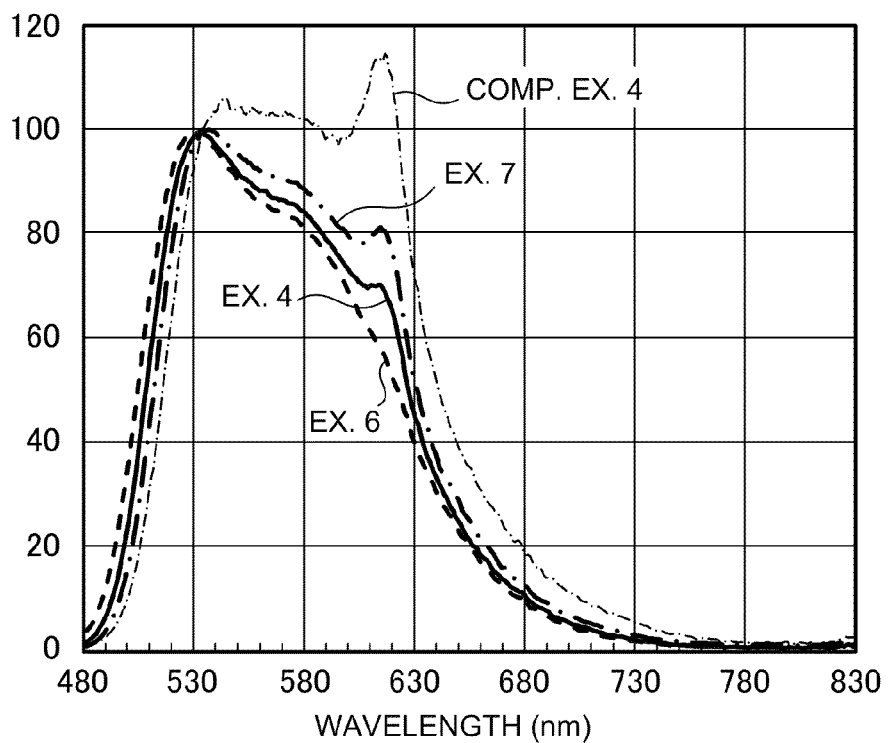
FIG. 7 is a graph showing the normalized light emission spectrums of phosphors according to the examples 4 and 6 to 7 of the present invention, and the phosphor according to the comparative example 4.
Figure 8:
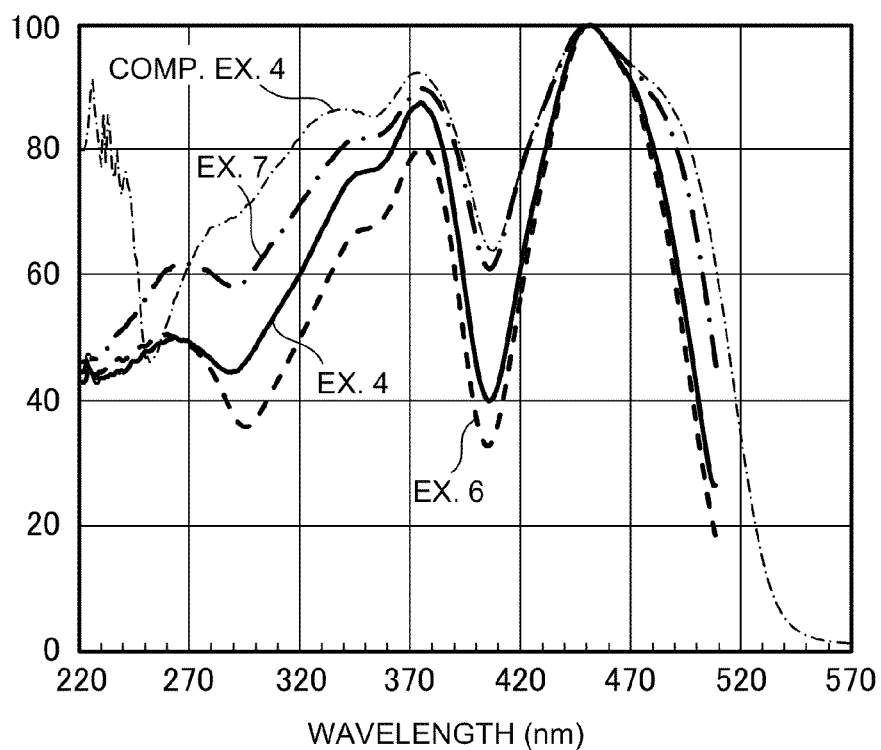
FIG. 8 is a graph showing the excitation spectrums of the phosphors according to the examples 4 and 6 to 7 of the present invention, and the comparative example 4.

Relative intensities and the like of phosphors according to examples 6 to 7 and a comparative example 4 are measured which have different composition ratios of Ce on the basis of the phosphor according to the example 4. The measured values of the phosphors according to the examples 6 to 7 and the comparative example 4 are shown in Tables 5 to 6, and FIGS. 7 to 8. Also, similar to the example 1, etc., the materials are adjusted to the mixture ratios shown in the Table 5, and the phosphors according to the examples 6 to 7 and the comparative example 4 are obtained. The particle diameters, powder properties, intensities and the like are measured. Also, FIGS. 7 and 8 show the normalized light emission spectrums and excitation spectrums of the phosphors according to the examples 6 to 7, and the comparative example 4, respectively. Table 6 shows composition ratios obtained by the analysis apparatus. As shown in Table 5 and FIG. 7, the relative intensities of the phosphors according to the examples 6 to 7 are higher than that of the comparative example 4. In other words, it can be confirmed that the intensities of the phosphors according to the examples 6 to 7 are improved. According to this result, when the compounding ratio of Ce is not smaller than 1, the relative intensity of the phosphor remarkably decreases. For this reason, it is preferable that the compounding ratio of Ce be smaller than 1. As shown in FIG. 8, it can be confirmed that the phosphor according to the example 5 is efficiently excited by blue light in a wavelength range from 420 to 470 nm.

TABLE 5

| Sample | La | Si | Ce | Pr | Particle Dia. Dm | Powder Properties x | y | 615/535 | Intensity 535 nm | Intensity 615 nm | Intensity Ratio 615/535 |
|---|---|---|---|---|---|---|---|---|---|---|---|
| Ex. 6 | 3 | 6 | 0.05 | 0.01 | 15.8 | 0.410 | 0.559 | 65.5 | 64.2 | 37.4 | 0.58 |
| Ex. 4 | | | 0.15 | | 8.3 | 0.422 | 0.551 | 76.1 | 73.9 | 50.8 | 0.69 |
| Ex. 7 | | | 0.3 | | 23.0 | 0.440 | 0.542 | 76.4 | 72.9 | 59.0 | 0.81 |
| Comp. Ex. 4 | | | 1 | | 14.3 | 0.465 | 0.521 | 34.9 | 30.4 | 33.9 | 1.12 |

TABLE 6

| Sample | Composition (Analyzed Value) | | | | Analyzed Value (ppm) | | |
|---|---|---|---|---|---|---|---|
| | La | Si | Ce | Pr | N | F | O |
| Ex. 6 | 2.57 | 6.00 | 0.05 | 0.0040 | 10.14 | 1800 | 1240 |
| Ex. 4 | 2.69 | 6.00 | 0.16 | 0.0148 | 10.92 | 1700 | 4550 |

TABLE 6-continued

| Sample | Composition (Analyzed Value) | | | | Analyzed Value (ppm) | | |
|---|---|---|---|---|---|---|---|
| | La | Si | Ce | Pr | N | F | O |
| Ex. 7 | 2.54 | 6.00 | 0.22 | 0.0111 | 10.98 | 590 | 980 |
| Comp. Ex. 4 | 1.91 | 6.00 | 0.70 | 0.0074 | 10.59 | 3300 | 1290 |

Light-Emitting Apparatus Using Phosphors of Comparative Example 1 and Example 3

Figure 9:
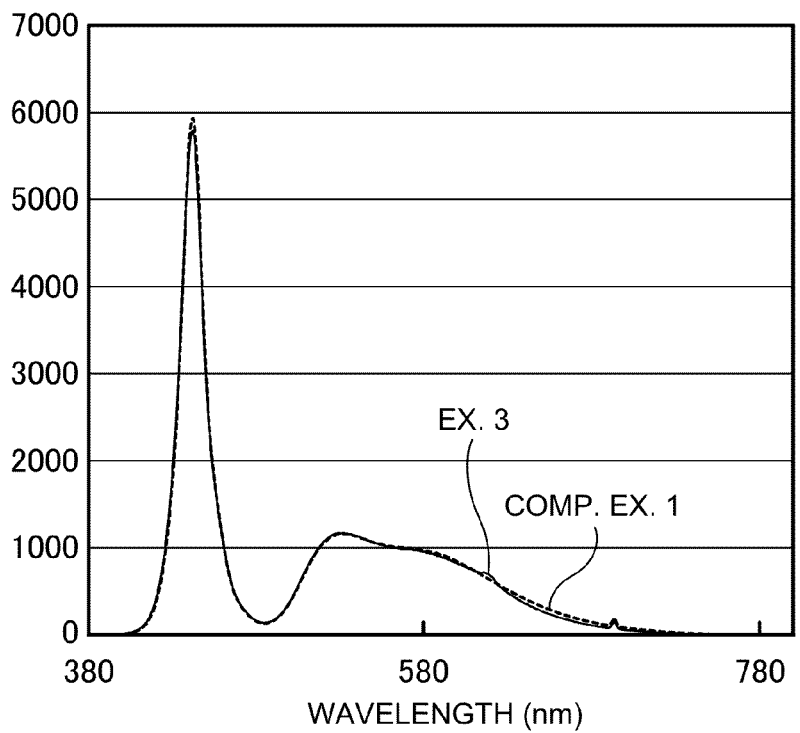
FIG. 9 is a graph showing the light emission spectrums of a light emitting apparatus according to the comparative example 1 and the example 3 of the present invention.
Figure 10:
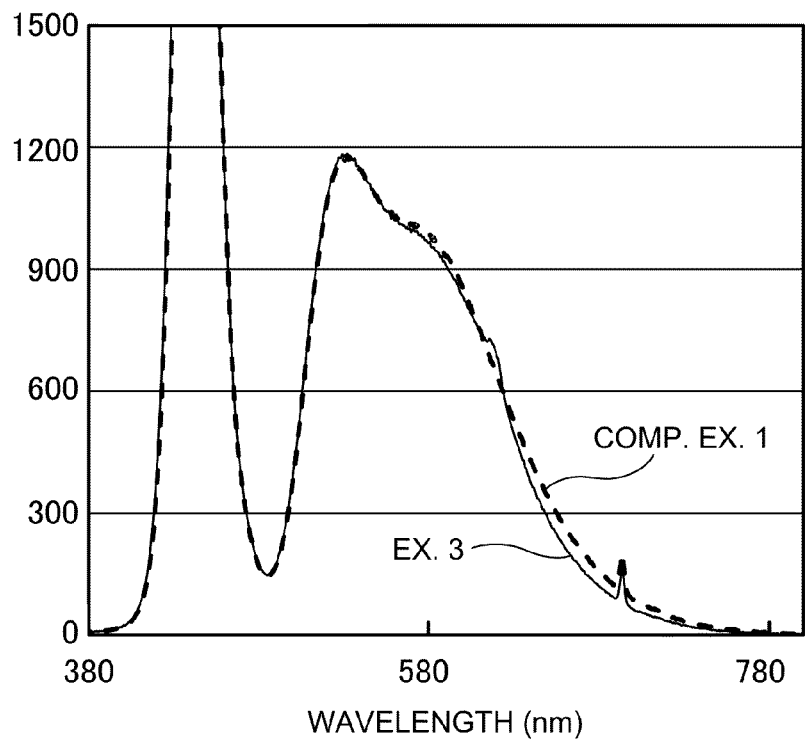
FIG. 10 is an enlarged graph of a range from 0 to 1,500 in light emission intensity in FIG. 9.

The results of light-emitting apparatuses including the phosphors according to the comparative example 1 and the example 3 are shown in Table 7 and FIGS. 9 to 10. The light-emitting apparatuses including the phosphor according to the comparative example 1 shown in the Table and Figures includes a phosphor for emitting red light in addition to the phosphor according to the comparative example 1. As shown in Table 7, CaAlSiN$_3$:Eu is used as a red phosphor in the comparative example 1. Contrary to this, the light-emitting apparatus including the phosphor according to the example 3 does not include the red phosphor. The light-emitting device is an LED device that has a size 500×290 μm, and emits light in a blue range with peak wavelength of 450 nm. The light emitting apparatus includes the LED device, and silicone resin that contains the phosphor and covers the LED device. FIG. 9 is a graph showing the light emission spectrums of the light-emitting apparatuses. FIG. 10 is an enlarged graph of a range from 0 to 1,500 in light emission intensity in FIG. 9. As shown in FIGS. 9 to 10, it can be confirmed that, although the light-emitting apparatus including the phosphor according to the example 3 does not include the red phosphor, its luminous flux ratio is relatively high, and is almost the same as the light-emitting apparatuses including the phosphor according to the comparative example 1. Since the aforementioned light-emitting apparatus includes only one type of phosphor according to the example, it is possible to reduce color unevenness, which may occur in a light-emitting apparatus including two or more types of single phosphors. In addition to this, it is confirmed that the aforementioned light-emitting apparatus include only one type of phosphor according to the example has good optical properties.

TABLE 7

| | Red Phosphor | Fwd. Cur. (mA) | Fwd. Vltg (V) | Luminous Flux Ratio | Chromaticity x | Chromaticity y |
|---|---|---|---|---|---|---|
| Comp. Ex. 1 | CaAlSiN$_3$:Eu | 150 | 3.3 | 100 | 0.266 | 0.236 |
| Ex. 3 | — | 150 | 3.3 | 99.4 | 0.265 | 0.236 |

As discussed above, it can be found that the phosphors according to the examples are efficiently excited by light having a main peak in a range from near-ultraviolet to blue light, and have a first peak in a range from 515 to 545 nm in their light emission spectrums. In addition, it can be found that the light emission intensity of these phosphors in proximity to 615 nm is not smaller than 56% of the light emission intensity at the first peak, and these phosphors can efficiently emit a red light component. If the amount of Pr added to the phosphor falls out of the range that does not allow the phosphor to emit light at the above light emission intensity ratio, the light may include an insufficient red light component. In the case where a light-emitting apparatus includes the phosphor according to the present invention together with a light-emitting device that emits light in a range from near-ultraviolet to blue light, the light-emitting apparatus can have a high light emission efficiency, good color rendering property, and good color reproduction range. In addition to this, in the case where a light-emitting apparatus includes an additional phosphor, it will be possible to further improve the light emission spectrum of the light-emitting apparatus. In this case, the amount of the additional red phosphor can be reduced. The reason is that the light emission intensity ($I_{p615}$) at 615 nm can be increased so that the red light component can be increased in the light-emitting apparatus. Alternatively, the additional red phosphor may not be required in the light-emitting apparatus. It is preferable that the composition ratio of the amount of Pr added to the phosphor fall within a range between 0 and 0.05.

A phosphor, a light-emitting apparatus including the phosphor, and a phosphor production method according to the present invention can be used for a white lighting source, LED display, back light source, signal light, illuminated switch, various sensors, various indicators, and the like that have a light source of a blue or ultraviolet light-emitting diode with good light emission properties. In particular, the phosphor according to the present invention can reduce color unevenness, and be reliable. Therefore, the phosphor according to the present invention has great value in industry.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims. The present application is based on Applications No. 2013-94771 filed in Japan on Apr. 26, 2013, and No. 2014-7917 filed in Japan on Jan. 20, 2014, the contents of which are incorporated herein by references.

Throughout the present specification, where compositions, apparatuses or processes are described as including or comprising specific components, or materials, or steps, it is contemplated by the inventors that compositions, apparatuses or processes of the present invention also consist essentially of, or consist of, the recited components, materials, or steps. Accordingly, throughout the present disclosure any described composition, apparatus or process of the present invention can consist essentially of, or consist of, the recited components, materials, or steps.

What is claimed is:

1. A phosphor represented by the general formula $M_xCe_yPr_zSi_6N_{8+w}$,
    wherein M is at least one element selected from the group consisting of La, Y, Tb and Lu,
    wherein $2.0<x<3.5$,
    $0<y<1.0$,
    $0<z<0.05$,
    $2.0<w<4.0$, and
    wherein the phosphor further contains 10 to 10,000 ppm of fluorine.

2. The phosphor according to claim 1, wherein $2.0<x<3.0$, $0<y<0.5$, and $0<z<0.03$.

3. The phosphor according to claim 1, wherein said phosphor can absorb light in a range from ultraviolet light to visible blue light and emit light different from the absorbed light,
    wherein the light emitted by said phosphor has a light emission spectrum including first and second peaks, and
    wherein the wavelengths of the first and second peaks fall within ranges from 515 to 545 nm, and 610 to 620 nm, respectively.

4. The phosphor according to claim 3, wherein the light emission intensity ratio ($I_{p2}/I_{p1}$) of the second peak relative to the first peak is defined in said emission spectrum, wherein $0.56<I_{p2}/I_{p1}$.

5. The phosphor according to claim 1, further containing 100 to 10,000 ppm of oxygen.

6. The phosphor according to claim 1, said phosphor comprising a crystal phase, wherein the percentage of the crystal phase is not less than 50% by weight.

7. A light emitting apparatus, comprising:
    an excitation light source that can emit light in a range from ultraviolet to blue light;
    the phosphor according to claim 1 as a first phosphor that can absorb a part of the light from said excitation light source, and can emit luminescent radiation; and
    a wavelength conversion member in which said first phosphor is distributed.

8. The light emitting apparatus according to claim 7, further comprising
    at least one second phosphor that can absorb at least a part of the light from said excitation light source, and can emit luminescent radiation with a peak wavelength different from that of said first phosphor.

9. A phosphor production method, comprising:
    preparing, pulverizing and mixing materials for elements to compose a composition of phosphor, the materials including the elements themselves, or oxide, nitride or carbonate of the elements, so as to provide obtained materials;
    filling a crucible with the obtained materials, and burning the obtained materials in a reducing atmosphere, so as to form a burned product;
    pulverizing the product, thereby obtaining phosphor powder,
    wherein said composition of phosphor is represented by the general formula $M_xCe_yPr_zSi_6N_{8+w}$, wherein M is at least one element selected from the group consisting of La, Y, Tb and Lu,
    wherein $2.0<x<3.5$,
    $0<y<1.0$,
    $0<z<0.05$,
    $2.0<w<4.0$ and
    wherein said materials contain fluoride.

10. The phosphor production method according to claim 9, wherein after the pulverizing step, the burned product is placed in an acid solution, thereby reducing the content of impurities contained in the burned product.

11. The phosphor production method according to claim 10, wherein said acid solution contains hydrochloric acid.

* * * * *